(12) United States Patent
Shen et al.

(10) Patent No.: US 9,391,016 B2
(45) Date of Patent: Jul. 12, 2016

(54) MIM CAPACITOR STRUCTURE

(71) Applicant: Taiwan Semiconductor Manufacturing Co., Ltd., Hsin-Chu (TW)

(72) Inventors: Shih-Guo Shen, New Taipei (TW); Wei-Min Tseng, New Taipei (TW); Chien-Chung Wang, New Taipei (TW); Huey-Chi Chu, Hsin-Chu (TW); Wen-Chuan Chiang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/249,513

(22) Filed: Apr. 10, 2014

(65) Prior Publication Data

US 2015/0294936 A1    Oct. 15, 2015

(51) Int. Cl.
| | |
|---|---|
| *H01L 23/522* | (2006.01) |
| *H01L 49/02* | (2006.01) |
| *H01L 21/3105* | (2006.01) |
| *H01L 21/768* | (2006.01) |
| *H01L 23/64* | (2006.01) |

(52) U.S. Cl.
CPC ...... *H01L 23/5223* (2013.01); *H01L 21/31053* (2013.01); *H01L 21/76802* (2013.01); *H01L 21/76877* (2013.01); *H01L 23/64* (2013.01); *H01L 23/642* (2013.01); *H01L 28/40* (2013.01); *H01L 28/60* (2013.01); *H01L 23/5226* (2013.01)

(58) Field of Classification Search
CPC ............ H01L 28/40–28/92; H01L 23/64; H01L 23/642
See application file for complete search history.

(56) References Cited

U.S. PATENT DOCUMENTS

| | | | | | |
|---|---|---|---|---|---|
| 5,541,428 | A | * | 7/1996 | Nagatomo | 257/306 |
| 5,903,023 | A | * | 5/1999 | Hoshi | 257/300 |
| 5,977,582 | A | * | 11/1999 | Fleming et al. | 257/310 |
| 6,046,467 | A | * | 4/2000 | Arita et al. | 257/295 |
| 6,115,233 | A | * | 9/2000 | Seliskar et al. | 361/303 |
| 6,227,211 | B1 | * | 5/2001 | Yang et al. | 134/1.1 |
| 6,281,134 | B1 | * | 8/2001 | Yeh et al. | 438/706 |
| 6,720,232 | B1 | * | 4/2004 | Tu et al. | 438/396 |
| 6,919,244 | B1 | * | 7/2005 | Remmel et al. | 438/239 |
| 7,956,400 | B2 | | 6/2011 | Smith | |

(Continued)

OTHER PUBLICATIONS

U.S. Appl. No. 14/289,739 Filed on May 29, 2014.

(Continued)

*Primary Examiner* — Matthew Landau
*Assistant Examiner* — Grant Withers
(74) *Attorney, Agent, or Firm* — Eschweiler & Associates, LLC (57) ABSTRACT

The present disclosure relates to an integrated chip having a MIM (metal-insulator-metal) capacitor and an associated method of formation. In some embodiments, the integrated chip has a MIM capacitor disposed within a capacitor inter-level dielectric (ILD) layer. An under-metal layer is disposed below the capacitor ILD layer and includes one or more metal structures located under the MIM capacitor. A plurality of vias vertically extend through the capacitor ILD layer and the MIM capacitor. The plurality of vias provide for an electrical connection to the MIM capacitor and to the under-metal layer. By using the plurality of vias to provide for vertical connections to the MIM capacitor and to the under-metal layer, the integrated chip does not use vias that are specifically designated for the MIM capacitor, thereby decreasing the complexity of the integrated chip fabrication.

20 Claims, 4 Drawing Sheets

(56) References Cited

U.S. PATENT DOCUMENTS

| | | | |
|---|---|---|---|
| 8,298,875 B1 | 10/2012 | Or-Bach et al. | |
| 8,546,914 B2 | 10/2013 | Su et al. | |
| 8,753,953 B1* | 6/2014 | Cheng et al. | 438/396 |
| 2001/0046737 A1* | 11/2001 | Ahn et al. | 438/253 |
| 2002/0094656 A1* | 7/2002 | Armacost et al. | 438/396 |
| 2003/0049885 A1* | 3/2003 | Iijima et al. | 438/106 |
| 2003/0178665 A1* | 9/2003 | Takenaka | 257/306 |
| 2003/0178666 A1* | 9/2003 | Lee et al. | 257/306 |
| 2003/0232481 A1 | 12/2003 | Huang et al. | |
| 2004/0061177 A1* | 4/2004 | Merchant et al. | 257/349 |
| 2004/0140527 A1* | 7/2004 | Furuya et al. | 257/532 |
| 2004/0180530 A1 | 9/2004 | Li et al. | |
| 2004/0256654 A1 | 12/2004 | Korner et al. | |
| 2005/0062130 A1* | 3/2005 | Ciancio et al. | 257/532 |
| 2005/0170583 A1* | 8/2005 | Park | 438/253 |
| 2005/0205913 A1* | 9/2005 | Yaegashi | 257/296 |
| 2006/0145293 A1* | 7/2006 | Cho | 257/532 |
| 2007/0045702 A1 | 3/2007 | Liang | |
| 2007/0200162 A1* | 8/2007 | Tu et al. | 257/314 |
| 2008/0055816 A1* | 3/2008 | Park et al. | 361/301.4 |
| 2008/0061345 A1* | 3/2008 | Wang | 257/306 |
| 2008/0217775 A1* | 9/2008 | Pai et al. | 257/751 |
| 2008/0277762 A1 | 11/2008 | Takewaki | |
| 2008/0290459 A1* | 11/2008 | Barth et al. | 257/532 |
| 2009/0008743 A1 | 1/2009 | Lee et al. | |
| 2009/0014835 A1* | 1/2009 | Furumiya et al. | 257/535 |
| 2009/0134493 A1 | 5/2009 | Iwaki | |
| 2009/0200638 A1* | 8/2009 | Smith | 257/532 |
| 2010/0065944 A1* | 3/2010 | Tu et al. | 257/532 |
| 2010/0079929 A1* | 4/2010 | Smeys et al. | 361/524 |
| 2010/0127350 A1* | 5/2010 | Totsuka | 257/532 |
| 2010/0164669 A1* | 7/2010 | Soendker et al. | 336/200 |
| 2010/0213572 A1* | 8/2010 | Ching et al. | 257/532 |
| 2010/0270643 A1* | 10/2010 | Iwaki | 257/532 |
| 2010/0289108 A1* | 11/2010 | Meinel et al. | 257/467 |
| 2010/0301451 A1* | 12/2010 | Iwaki | 257/532 |
| 2011/0303284 A1 | 12/2011 | Kim et al. | |
| 2012/0091559 A1* | 4/2012 | Tu et al. | 257/532 |
| 2012/0181657 A1* | 7/2012 | Wu et al. | 257/532 |
| 2012/0199946 A1* | 8/2012 | Kageyama | 257/532 |
| 2012/0319239 A1* | 12/2012 | Chang et al. | 257/532 |
| 2013/0020678 A1* | 1/2013 | Tu et al. | 257/532 |
| 2013/0193556 A1* | 8/2013 | Lee et al. | 257/532 |
| 2013/0270675 A1* | 10/2013 | Childs et al. | 257/532 |
| 2013/0277680 A1 | 10/2013 | Green et al. | |
| 2013/0285203 A1* | 10/2013 | Hiroi et al. | 257/532 |
| 2013/0292794 A1* | 11/2013 | Pai et al. | 257/532 |
| 2013/0300003 A1* | 11/2013 | Sun et al. | 257/788 |
| 2013/0320493 A1* | 12/2013 | Chang et al. | 257/532 |
| 2014/0159200 A1* | 6/2014 | Loke et al. | 257/532 |
| 2014/0291805 A1* | 10/2014 | Hong | 257/532 |
| 2015/0028408 A1* | 1/2015 | Meiser et al. | 257/302 |
| 2015/0048483 A1* | 2/2015 | Kuo et al. | 257/532 |
| 2015/0061073 A1 | 3/2015 | Kim et al. | |
| 2015/0108605 A1* | 4/2015 | Park et al. | 257/532 |
| 2015/0115408 A1* | 4/2015 | Sun et al. | 257/532 |

OTHER PUBLICATIONS

U.S. Appl. No. 14/249,482 filed on Apr. 10, 2014.
U.S. Appl. No. 14/249,498 filed on Apr. 10, 2014.
Non Final Office Action Dated Jul. 14, 2015 U.S. Appl. No. 14/289,739.
Notice of Allowance dated Aug. 14, 2015 for U.S. Appl. No. 14/249,482.
Non-Final Office Action dated Aug. 14, 2015 for U.S. Appl. No. 14/249,498.
Final Office Action Dated Dec. 14, 2015 U.S. Appl. No. 14/249,498.
Final Office Action Dated Dec. 31, 2015 for U.S. Appl. No. 14/289,739.
Notice of Allowance dated Feb. 12, 2016 for U.S. Appl. No. 14/249,498.
Notice of Allowance Dated Apr. 22, 2016 U.S. Appl. No. 14/289,739.

* cited by examiner

MIM CAPACITOR STRUCTURE

BACKGROUND

Integrated chips are formed on semiconductor die comprising millions or billions of transistor devices. The transistor devices are configured to act as switches and/or to produce power gains so as to enable logical functionality for an integrated chip (e.g., form a processor configured to perform logic functions). Integrated chips often also comprise passive devices, such as capacitors, resistors, inductors, varactors, etc. Passive devices are widely used to control integrated chip characteristics (e.g., gain, time constants, etc.) and to provide a single integrated chip with a wide range of different functionalities (e.g., manufacturing analog and digital circuitry on the same die).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MIM (metal-insulator-metal) capacitors are a particular type of capacitor, having a top metal plate and a bottom metal plate separated by a capacitor dielectric, which are often implemented in integrated circuits. MIM capacitors can be used as decoupling capacitors configured to mitigate power supply or switching noise caused by changes in current flowing through various parasitic inductances associated with an integrated chip and a package in which the integrated chip is located. For example, simultaneous switching of the input/output (I/O) and core circuits within an integrated chip can cause a voltage drop on a power supply source by an amount proportional to the inductance of a power bus. This power supply noise may increase signal delay, thereby reducing the operating frequency of a system-on-a-chip (SoC), and inadvertently cause state transitions in logic circuits within the SoC.

MIM capacitors are often integrated into back-end-of-the-line (BEOL) metallization stack, at a position that is vertically disposed between an underlying first metal layer and an overlying second metal layer. However, positioning a MIM capacitor within a BEOL metallization stack can present a number of fabrication problems. For example, MIM capacitors typically have a large number of layers that lead to a topography (e.g., having a step size of more than 400 nm) which is greater than most BOEL metallization layers. Furthermore, metal interconnect layers are not permitted since hillocks, or spike like projections, from such 'under-metal layers' may cause electrical shorting between the under-metal layers and the MIM capacitor.

The present disclosure relates to an integrated chip having a MIM (metal-insulator-metal) capacitor and an associated method of formation. In some embodiments, the integrated chip comprises a MIM capacitor disposed within a capacitor inter-level dielectric (ILD) layer. An under-metal layer is disposed below the capacitor ILD layer and comprises one or more metal structures located under the MIM capacitor. A plurality of vias are configured to vertically extend through the capacitor ILD layer and the MIM capacitor. The plurality of vias are configured to provide for an electrical connection to the MIM capacitor and to the under-metal layer. By using the plurality of vias to provide for vertical connections to the MIM capacitor and to the under-metal layer, the integrated chip does not use vias that are specifically designated for the MIM capacitor, thereby decreasing the complexity of the integrated chip fabrication.

Figure 1:
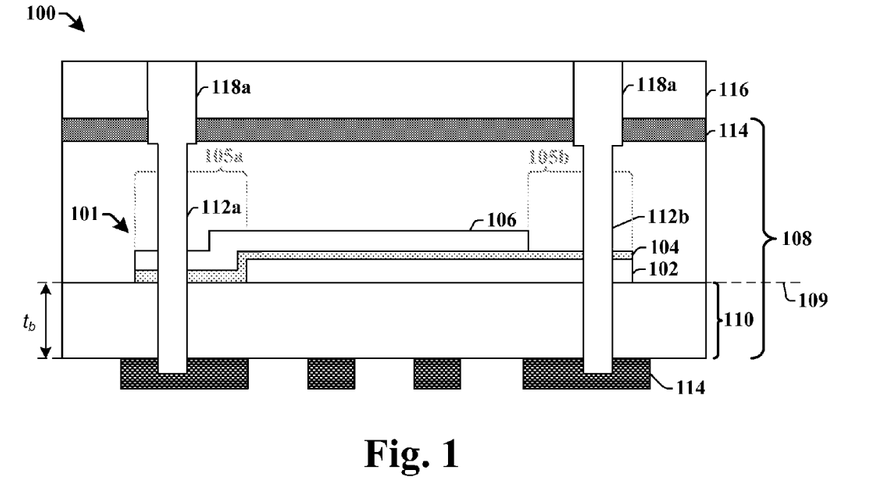
FIG. 1 illustrates a cross-sectional view of some embodiments of an integrated chip having a MIM (metal insulator metal) capacitor.

FIG. 1 illustrates a cross-sectional view of some embodiments of an integrated chip 100 having a MIM (metal-insulator-metal) capacitor 101.

The MIM capacitor 101 includes a bottom electrode comprising a bottom capacitor metal layer 102 and a top electrode comprising a top capacitor metal layer 106. The bottom and top capacitor metal layers, 102 and 106, are electrically isolated from one another by a capacitor dielectric layer 104. The capacitor dielectric layer 104 is configured to separate the bottom capacitor metal layer 102 (i.e., the bottom electrode) from the overlying top capacitor metal layer 106 (i.e., the top electrode), so that the MIM capacitor 101 is able to store energy in an electric field generated between the bottom and top electrodes.

The bottom and top capacitor metal layers, 102 and 106, are laterally displaced from one another, such that the bottom capacitor metal layer 102 extends beyond the top capacitor metal layer 106 in a first direction, while the top capacitor metal layer 106 extends beyond the bottom capacitor metal layer 102 in an opposite, second direction. For example, in MIM capacitor 101, the top capacitor metal layer 106 extends beyond the bottom capacitor metal layer in region 105a, while the bottom capacitor metal layer 102 extends beyond the top capacitor metal layer in region 105b.

The MIM capacitor 101 is disposed within a capacitor inter-level dielectric (ILD) layer 108. In various embodiments, the capacitor ILD layer 108 may comprise one or more dielectric materials. For example, the capacitor ILD layer 108 may comprise a low-k dielectric material, an oxide material, etc. In some embodiments, the capacitor ILD layer 108 may extend below a bottom surface of the MIM capacitor 101 (below line 109) as a dielectric buffer layer 110. In various embodiments, the dielectric buffer layer 110 may have a thickness $t_b$ that is in a range of between approximately 5% and approximately 50% of the thickness of the capacitor ILD layer 108.

An under-metal layer 114 comprising one or more metal structures is disposed under the MIM capacitor 101 at a position below the dielectric buffer layer 110. By separating the bottom capacitor metal layer 102 from the under-metal layer 114, the dielectric buffer layer 110 is configured to prevent hillocks (i.e., hill-like or spike-like projections) from the under-metal layer 114 from electrically shorting to the bottom capacitor metal layer 102 of the MIM capacitor 101. Furthermore, by isolating the MIM capacitor 101 from under-metal layer 114 the dielectric buffer layer 110 also prevents the MIM capacitor 101 from introducing a parasitic capacitance into the under-metal layer 114.

The MIM capacitor 101 further comprises a plurality of vias 112, which are configured to provide for vertical connections perpendicular to the top surface of the capacitor ILD layer 108. The plurality of vias 112 are configured to vertically extend from a metal interconnect layer 118 within a metal interconnect ILD layer 116 overlying a planar etch stop layer 114, through the MIM capacitor 101 to the under-metal layer 114. The plurality of vias 112 provide for an electrical connection to both the MIM capacitor 101 and to the under-metal layer 114. Because the bottom and top capacitor metal layers, 102 and 106, are laterally displaced from one another, the plurality of vias 112 are able to provide for connections to one of the bottom or top capacitor metal layers, 102 or 106, without electrically contacting the other capacitor metal layer.

For example, a first via 112a is configured to vertically extend through the top capacitor metal layer 106, and to provide for an electrical connection to the top capacitor metal layer 106 and to the under-metal layer 114. A second via 112b is configured to vertically extend through the bottom capacitor metal layer 102, and to provide for an electrical connection to the bottom capacitor metal layer 102 and to the under-metal layer 114. By using the plurality of vias 112 to provide for vertical connections to the MIM capacitor 101 and the under-metal layer 114, the integrated chip 100 does not use vias that are specifically designated for the MIM capacitor, thereby decreasing the complexity of fabrication of the integrated chip 100.

Figure 2:
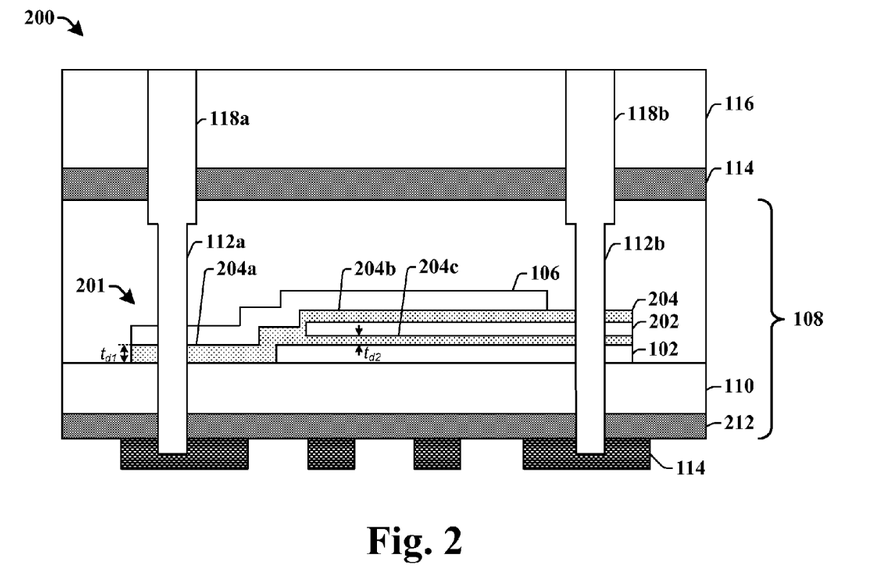
FIG. 2 illustrates a cross-sectional view of some additional embodiments of an integrated chip having a MIM capacitor.

FIG. 2 illustrates a cross-sectional view of some additional embodiments of an integrated chip 200 having a MIM capacitor 201.

The MIM capacitor 201 comprises a bottom electrode comprising a bottom capacitor metal layer 102, a middle electrode comprising a middle capacitor metal layer 202, and a top electrode comprising a top capacitor metal layer 106.

The bottom capacitor metal layer 102, the middle capacitor metal layer 202, and the top capacitor metal layer 106, are disposed within a capacitor inter-level dielectric (ILD) layer 108 disposed over a semiconductor substrate (not shown). In some embodiments, the bottom capacitor metal layer 102, the middle capacitor metal layer 202, and the top capacitor metal layer 106 may respectively have a thickness in a range of between approximately 100 angstroms and approximately 800 angstroms.

The bottom capacitor metal layer 102, the middle capacitor metal layer 202, and the top capacitor metal layer 106, are separated from one another by a capacitor dielectric layer 204. The capacitor dielectric layer 204 branches out from a main branch 204a to an upper branch 204b and a lower branch 204c. The middle capacitor metal layer 202 is disposed between the upper branch 204b and a lower branch 204c. The branching of the capacitor dielectric layer 204 causes a thickness of the capacitor dielectric layer 204 to vary as a function of position. For example, the main branch 204a of the dielectric layer has a first thickness $t_{d1}$, while the upper branch 204b and a lower branch 204c have a second thickness $t_{d2}$ less than the first thickness $t_{d1}$. In some embodiments, the second thickness $t_{d2}$ may have a range of between approximately 20 angstroms and approximately 200 angstroms.

In various embodiments, the bottom capacitor metal layer 102, the middle capacitor metal layer 202, and the top capacitor metal layer 106 may comprise various conductive materials, such as indium tin oxide (ITO), aluminum (Al), titanium (Ti), titanium nitride (TiN), tantalum (Ta), tantalum nitride (TaN), tungsten (W), tungsten nitride (WN), molybdenum nitride (MoN), copper (Cu), platinum (Pt), palladium (Pd), osmium (Os), ruthenium (Ru), iridium oxide ($IrO_2$), rhenium oxide ($ReO_2$), rhenium trioxide ($ReO_3$), or a combination thereof.

In some embodiments, the capacitor dielectric layer 204 may comprise a high-k dielectric material (i.e., a dielectric material having a dielectric constant greater than silicon dioxide). In some embodiments, the capacitor dielectric layer 204 may comprise a single layer of dielectric material. For example, in various embodiments, the capacitor dielectric layer 204 may comprise a layer of silicon dioxide ($SiO_2$), silicon nitride ($Si_3N_4$), aluminum oxide ($Al_2O_3$), tantalum oxide ($Ta_2O_5$), titanium oxide ($TiO_2$), strontium titanate (Sr-$TiO_3$), zirconium oxide ($ZrO_2$), hafnium oxide ($HfO_2$), hafnium silicate ($HfSiO_4$), lanthanum oxide ($La_2O_3$), yttrium oxide ($Y_2O_3$), etc. In other embodiments, the capacitor dielectric layer 204 may comprise a complex dielectric layer having two or more layers of different dielectric materials (e.g., a layer of $SiO_2$ and a layer of $Si_3N_4$).

A planar etch stop layer 114 is disposed over the capacitor ILD layer 108. The planar etch stop layer 114 has a planar surface that extends over the MIM capacitor 201. The planar surface is parallel to a top surface of an underlying semiconductor substrate. A metal ILD layer 116 is disposed over the planar etch stop layer 114. The metal ILD layer 116 surrounds a metal interconnect layer 118 comprising a conductive material (e.g., copper, aluminum, etc.). A plurality of vias 112 are coupled to the metal interconnect layer 118 and are configured to vertically extend through a planar etch stop layer 114 and the MIM capacitor 201 to the under-metal layer 114. By connecting the plurality of vias 112 to the MIM capacitor 201 and to the under-metal layer 114 the fabrication of the plurality of vias 112 is simplified. This is because the stacked electrode structure of a MIM capacitor often provides for topography differences between metal layers (e.g., between a capacitor top and bottom metal layers). The topography differences can make it difficult to form vias since more dielectric material must be etched to reach the bottom capacitor metal layer than to reach the top capacitor metal layer. By connecting the plurality of vias 112 to the under-metal layer 114, the plurality of vias 112 are formed to a same depth, thereby avoiding etching differences caused by uneven topography.

Figure 3:
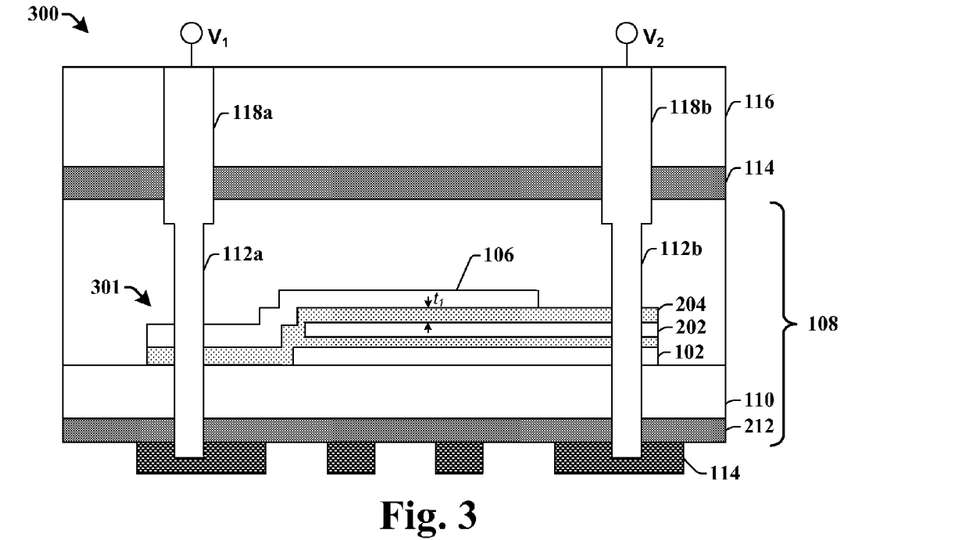
FIG. 3 illustrates a cross-sectional view of some additional embodiments of an integrated chip having a MIM capacitor with an I/O connection.
Figure 4:
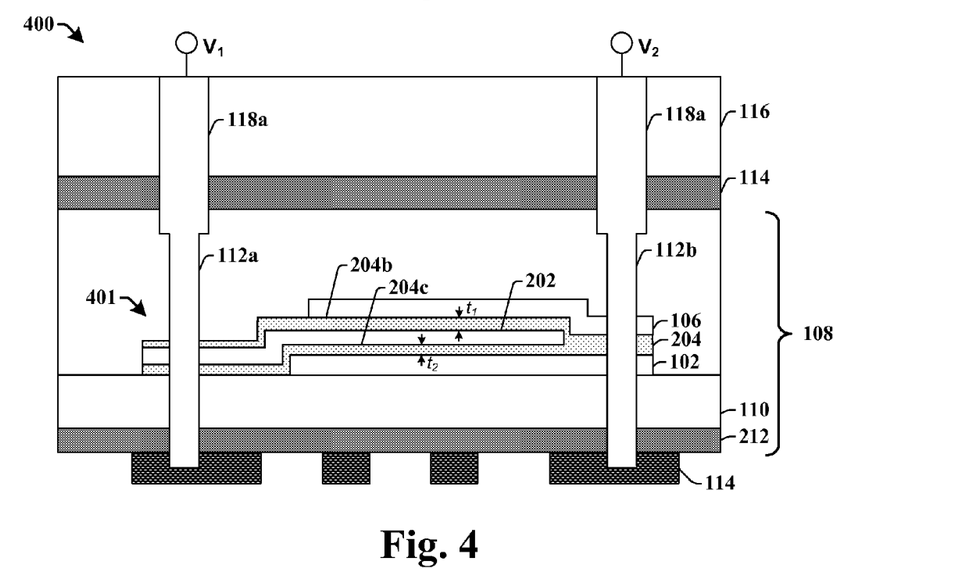
FIG. 4 illustrates a cross-sectional view of some additional embodiments of an integrated chip having a MIM capacitor with a core connection.
Figure 5:
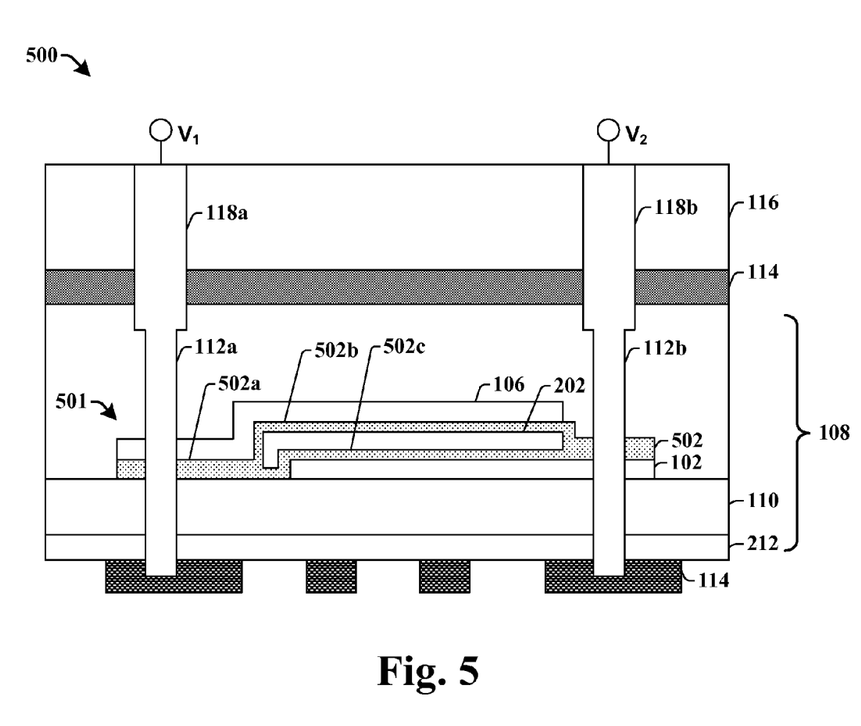
FIG. 5 illustrates a cross-sectional view of some additional embodiments of an integrated chip having a MIM capacitor with a series connection.

It will be appreciated that by providing signals to different capacitor metal layers, the disclosed MIM capacitor can have different capacitive values and therefore can be used for different purposes (e.g., be used for core and I/O connection demands). This is because the different thicknesses of the disclosed capacitor dielectric layer allow for the disclosed MIM capacitor to provide for different capacitive values. For example, a thicker capacitor dielectric layer provides a MIM capacitor with a lower capacitance (and a lower leakage). FIGS. 3-5 illustrate cross-sectional views of some embodiments of an integrated chip having a MIM capacitor configured to provide for different capacitance values.

FIG. 3 illustrates a cross-sectional view of some embodiments of an integrated chip 300 having a MIM capacitor 301 configured to provide for an I/O connection.

MIM capacitor 301 has a first via 112a connected to a top capacitor metal layer 106 and a second via 112b connected to a middle capacitor metal layer 202. The middle capacitor metal layer 202 and the top capacitor metal layer 106 are separated by a capacitor dielectric layer 204 having a first thickness $t_1$. Connecting the top capacitor metal layer 106 to a first voltage $V_1$ (e.g., $V_{DD}$) and the middle capacitor metal layer 202 to a second voltage $V_2$ (e.g., $V_{SS}$) smaller than the first voltage will provide MIM capacitor 301 with a lower capacitance (and a lower leakage) for an I/O connection, which is proportional to a distance between the top capacitor metal layer 106 and the middle capacitor metal layer 202.

FIG. 4 illustrates a cross-sectional view of some embodiments of an integrated chip 400 having a MIM capacitor 401 configured to provide for a core connection.

MIM capacitor 401 has a first via 112a connected to a middle capacitor metal layer 202 and a second via 112b connected to a top capacitor metal layer 106 and a bottom capacitor metal layer 102. The top capacitor metal layer 106 and the middle capacitor metal layer 202 are separated by a capacitor dielectric layer 204b having a first thickness $t_1$, and the middle capacitor metal layer 202 and the bottom capacitor metal layer 102 are separated by a capacitor dielectric layer 204c having a second thickness $t_2$. Connecting the middle capacitor metal layer 202 to a first voltage $V_1$ (e.g., $V_{DD}$) and connecting the top capacitor metal layer and the bottom capacitor metal layer 102 to a second voltage $V_2$ (e.g., $V_{SS}$) smaller than the first voltage provides MIM capacitor 301 with a higher capacitance for a core connection than for an I/O connection (e.g., as shown in FIG. 3). The higher capacitance is contributed to by capacitor dielectric layer 204b and capacitor dielectric layer 204c.

FIG. 5 illustrates a cross-sectional view of some embodiments of an integrated chip 500 having a MIM capacitor 501 with a series connection.

MIM capacitor 501 comprises capacitor dielectric layer 502 configured to separate a bottom capacitor metal layer 102 from a middle capacitor metal layer 202 and the middle capacitor metal layer 202 from a top capacitor metal layer 106. In some embodiments, the capacitor dielectric layer 502 may comprise an opening that contains the middle capacitor metal layer 202. For example, the capacitor dielectric layer 502 may branch out from a main branch 502a to an upper branch 502b and a lower branch 502c, and then converge back to the main branch 502a. A middle capacitor metal layer 202 is disposed above the lower branch 502c of the capacitor dielectric layer 502 along a portion of the bottom capacitor metal layer 102, so that the capacitor dielectric layer 502 extends beyond both sides of the middle capacitor metal layer 202.

The top capacitor metal layer 106 is disposed onto the main branch 502a and the upper branch 502b of the capacitor dielectric layer 502. The top capacitor metal layer 106 comprises a stepped metal layer that extends from the main branch 502a of the capacitor dielectric layer 204 to the upper branch 502b of the capacitor dielectric layer 502. By extending from the main branch 502a to the upper branch 502b, the top capacitor metal layer 106 is both laterally disposed from the middle capacitor metal layer 202 and vertically disposed above the middle capacitor metal layer 202.

A first via 112a and a second via 112a extend through a planar etch stop layer 114 and the MIM capacitor 501 to an under-metal layer 114. The first via 112a connects a first voltage $V_1$ (e.g., $V_{DD}$) to the top capacitor metal layer 106 and to the under-metal layer 114. The second via 112b connects a second voltage $V_2$ (e.g., $V_{SS}$), smaller than the first voltage $V_1$, to the bottom capacitor metal layer 102 and to the under-metal layer 114. By connecting the first via 112a to the first voltage and the second via 112b to the second voltage, a series connection is formed for higher voltage applications.

Figure 6:
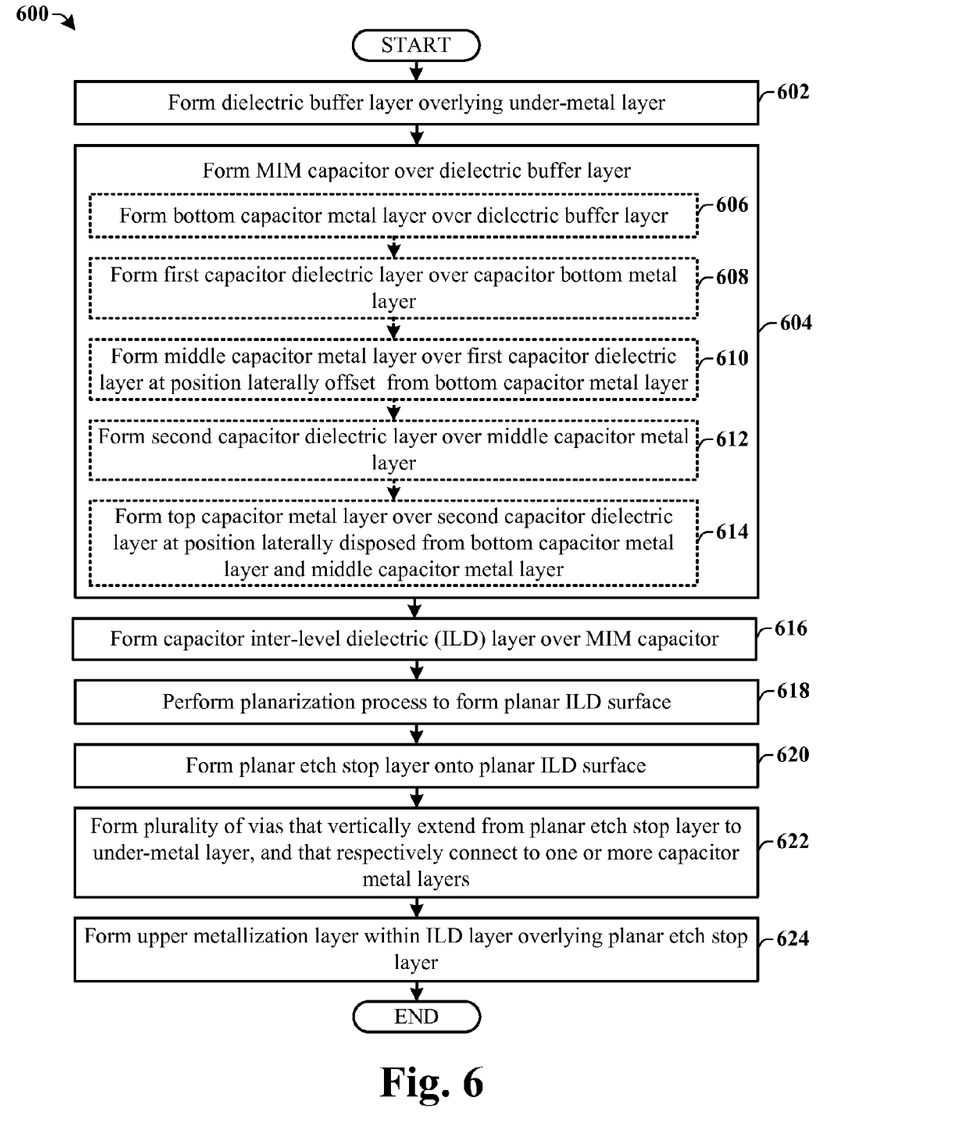
FIG. 6 illustrates a flow diagram of some embodiments of a method of forming an integrated chip comprising a MIM capacitor.

FIG. 6 illustrates a flow diagram of some embodiments of a method 600 of forming an integrated chip comprising a MIM capacitor.

While method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, a dielectric buffer layer is formed over an underlying under-metal layer. The under-metal layer comprises a metal inter-connect layer within a back-end-of-the-line (BEOL) stack of an integrated chip.

At 604, a MIM (metal-insulator-metal) capacitor is formed over the dielectric buffer layer. In some embodiments, the MIM capacitor may be formed by formed according to acts 606-614.

At 606, a bottom capacitor metal layer is formed over the dielectric buffer layer. In some embodiments, the bottom capacitor metal layer is formed onto and in direct contact with the dielectric buffer layer.

At 608, a first capacitor dielectric layer is formed over the bottom capacitor metal layer.

At 610, a middle capacitor metal layer is formed over the first capacitor dielectric layer. The middle capacitor metal layer is formed at a position that is laterally offset from the bottom capacitor metal layer (i.e., at a position that allows for the middle capacitor metal layer to extend beyond the bottom capacitor metal layer).

At 612, the second capacitor dielectric layer is formed over the middle capacitor metal layer. In some embodiments, the first and second capacitor dielectric layers may comprise different dielectric layers. In other embodiments, the first and second capacitor dielectric layers may comprise a same dielectric layer that extends continuously between the bottom capacitor metal layer, the middle capacitor metal layer, and a top capacitor metal layer (formed at act 614).

At 614, a top capacitor metal layer is formed over the second capacitor dielectric layer at a position that is laterally offset from the bottom capacitor metal layer and the middle capacitor metal layer (i.e., at a position that allows for the top capacitor metal layer to extend beyond the bottom capacitor metal layer and the middle capacitor metal layer).

At 616, a capacitor inter-level dielectric (ILD) layer comprising an insulating dielectric material is formed over the MIM capacitor.

At 618, a planarization process is performed to remove a portion of the capacitor ILD layer and to form a planar capacitor ILD surface overlying the MIM capacitor.

At 620, a planar etch stop layer is formed over the capacitor ILD layer. In some embodiments, the planar etch stop layer is formed by performing a planarization process on the capacitor ILD layer to form a substantially planar surface. The planar etch stop layer is then deposited onto the substantially planar surface to form the planar etch stop layer.

At 622, a plurality of vias may be formed that vertically extend from the planar etch stop layer to the under-metal layer, and respectively connect to one or more capacitor metal layers. The plurality of vias may be formed performing a selective etching process to form openings vertically extending through the planar etch stop layer, the capacitor ILD layer, the MIM capacitor (e.g., the top capacitor metal layer, the bottom capacitor metal layer, etc.), and the dielectric buffer layer. A metal (e.g., copper, tungsten, aluminum, etc.) is then deposited within the openings to form the plurality of vias.

At 624, an upper metallization layer is formed within a metal inter-level dielectric (ILD) layer overlying the planar etch stop layer. In some embodiments, the upper metallization layer may comprise a metal wire layer comprising a conductive material configured to provide a lateral connection. In some embodiments, the upper metallization layer may be formed by performing a selective etching process to form trenches within the metal ILD layer and then depositing a metal (e.g., copper, aluminum, etc.) within the trenches in the metal ILD layer.

Therefore, the present disclosure relates to an integrated chip having a MIM (metal-insulator-metal) capacitor and an associated method of formation.

In some embodiments, the present disclosure relates to an integrated chip. The integrated chip comprises a MIM (metal-insulator-metal) capacitor disposed within a capacitor inter-level dielectric (ILD) layer, and an under-metal layer disposed below the capacitor ILD layer and comprising one or more metal structures located under the MIM capacitor. The integrated chip further comprises a plurality of vias configured to extend through the capacitor ILD layer and the MIM capacitor, so that respective vias are configured to provide for an electrical connection to the MIM capacitor and to the under-metal layer.

In other embodiments, the present disclosure relates to a MIM (metal-insulator-metal) capacitor. The MIM capacitor comprises a first electrode comprising a bottom capacitor metal layer disposed onto and in direct contact with a dielectric buffer layer located over an under-metal layer comprising one or more metal structures located under the bottom capacitor metal layer. The MIM capacitor further comprises a capacitor dielectric layer disposed over the bottom capacitor metal layer, and a second electrode comprising a top capacitor metal layer disposed over the bottom capacitor metal layer at a position that causes the top capacitor metal layer to be laterally displaced from the bottom capacitor metal layer. The MIM capacitor further comprises a plurality of vias configured to extend through the bottom capacitor metal layer or the top capacitor metal layer to the under-metal layer, so that respective vias are configured to provide for an electrical connection to the bottom capacitor metal layer or the top capacitor metal layer and to the under-metal layer.

In yet other embodiments, the present disclosure relates to a method of forming a capacitor. The method comprises forming a MIM (metal-insulator-metal) capacitor disposed within capacitor inter-level dielectric (ILD) layer. The method further comprises forming an under-metal layer disposed below the capacitor ILD layer and comprising one or more metal structures located under the MIM capacitor. The method further comprises forming a plurality of vias configured to extend through the ILD dielectric layer and the MIM capacitor, so that respective vias are configured to provide for an electrical connection to the MIM capacitor and to the under-metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a MIM (metal-insulator-metal) capacitor disposed within a capacitor inter-level dielectric (ILD) layer and having a first electrode comprising a bottom capacitor metal layer vertically separated by a capacitor dielectric layer from a second electrode comprising a top capacitor metal layer, wherein an outer sidewall of the first electrode is laterally aligned with a first outer sidewall of the capacitor dielectric layer and an outer sidewall of the second electrode is laterally aligned with a second outer sidewall of the capacitor dielectric layer opposing the first outer sidewall;
an under-metal layer disposed below the capacitor ILD layer and comprising one or more metal structures located under the MIM capacitor; and
a plurality of vias vertically extending through the capacitor ILD layer and the MIM capacitor to the under-metal layer.

2. The integrated chip of claim 1, wherein the capacitor ILD layer extends below the MIM capacitor to form a dielectric buffer layer that separates the MIM capacitor from the under-metal layer.

3. The integrated chip of claim 2, wherein the second electrode is disposed over the bottom capacitor metal layer at a position that causes the top capacitor metal layer to be laterally displaced from the bottom capacitor metal layer.

4. The integrated chip of claim 3, wherein the plurality of vias comprise:
a first via vertically extending through the bottom capacitor metal layer at a first position laterally disposed from the top capacitor metal layer; and
a second via vertically extending through the top capacitor metal layer at a second position laterally disposed from the bottom capacitor metal layer.

5. The integrated chip of claim 2, wherein the bottom capacitor metal layer is disposed onto and in direct contact with the dielectric buffer layer.

6. The integrated chip of claim 1, wherein the MIM capacitor further comprises:

a third electrode comprising a middle capacitor metal layer, arranged between and separated from the top capacitor metal layer and the bottom capacitor metal layer by the capacitor dielectric layer.

7. The integrated chip of claim 6, wherein the capacitor dielectric layer has a first thickness at a first position between the bottom capacitor metal layer and the top capacitor metal layer and a second thickness at a second position between the bottom capacitor metal layer and the middle capacitor metal layer.

8. The integrated chip of claim 7,
wherein the capacitor dielectric layer branches out from a main branch abutting a dielectric buffer layer that separates the MIM capacitor from the under-metal layer to a lower branch and an upper branch; and
wherein the lower branch is disposed between the bottom capacitor metal layer and the middle capacitor metal layer, and wherein the upper branch is disposed between the middle capacitor metal layer and the top capacitor metal layer.

9. The integrated chip of claim 6, wherein the bottom capacitor metal layer, the middle capacitor metal layer, and the top capacitor metal layer respectively have a thickness that is between approximately 100 angstrom and approximately 800 angstrom.

10. The integrated chip of claim 6, wherein the third electrode is separated from a first via contacting the first electrode and is further separated from a second via contacting the second electrode, and wherein the first via and the second via are different vias.

11. The integrated chip of claim 6, wherein the plurality of vias comprise a first via coupled to the first electrode and the third electrode, and a second via coupled to the second electrode.

12. The integrated chip of claim 6, wherein the third electrode is not in contact with an underlying or an overlying via.

13. The integrated chip of claim 1, further comprising:
a substantially planar second etch stop layer disposed over the capacitor ILD layer.

14. A MIM (metal-insulator-metal) capacitor, comprising:
a first electrode comprising a bottom capacitor metal layer disposed onto and in direct contact with a dielectric buffer layer located over an under-metal layer comprising one or more metal structures located under the bottom capacitor metal layer;
a capacitor dielectric layer disposed over the bottom capacitor metal layer;
a second electrode comprising a top capacitor metal layer disposed over the bottom capacitor metal layer at a position that causes the top capacitor metal layer to be laterally displaced from the bottom capacitor metal layer;
a third electrode having an 'L' shape and comprising a middle capacitor metal layer, vertically separated from the top capacitor metal layer and the bottom capacitor metal layer by the capacitor dielectric layer and laterally separated from a first via contacting the first electrode and a second via contacting the second electrode, wherein the first via and the second via are different vias wherein the third electrode comprises opposing outermost sidewalls that are between the first and second vias; and wherein the first via and the second via vertically extend through the bottom capacitor metal layer or the top capacitor metal layer to the under-metal layer.

15. The MIM capacitor of claim 14, wherein a thickness of the capacitor dielectric layer varies from a first thickness at a first position between the bottom capacitor metal layer and the top capacitor metal layer, and a second thickness at a second position between the bottom capacitor metal layer and the middle capacitor metal layer.

16. The MIM capacitor of claim 14,
wherein the capacitor dielectric layer branches out from a main branch abutting the dielectric buffer layer to a lower branch and an upper branch,
wherein the lower branch is disposed between the bottom capacitor metal layer and the middle capacitor metal layer, and wherein the upper branch is disposed between the middle capacitor metal layer and the top capacitor metal layer.

17. The MIM capacitor of claim 14, further comprising:
a capacitor inter-level dielectric (ILD) layer disposed over the top capacitor metal layer; and
a substantially planar second etch stop layer disposed over the capacitor ILD layer.

18. A method of forming an integrated chip having a MIM (metal-insulator-metal) capacitor, comprising:
forming a MIM (metal-insulator-metal) capacitor disposed within capacitor inter-level dielectric (ILD) layer and comprising a first electrode vertically separated from a second electrode by a capacitor dielectric layer, wherein an outer sidewall of the first electrode is laterally aligned with a first outer sidewall of the capacitor dielectric layer and an outer sidewall of the second electrode is laterally aligned with a second outer sidewall of the capacitor dielectric layer opposing the first outer sidewall;
forming an under-metal layer disposed below the capacitor ILD layer and comprising one or more metal structures located under the MIM capacitor; and
forming a plurality of vias vertically extending through the capacitor ILD layer and the MIM capacitor to the under-metal layer.

19. The method of claim 18, wherein forming the MIM capacitor, comprises:
forming a bottom capacitor metal layer;
forming a first capacitor dielectric layer onto the bottom capacitor metal layer;
forming a middle capacitor metal layer over the first capacitor dielectric layer at a position that is laterally offset from the bottom capacitor metal layer;
forming a second capacitor dielectric layer onto the middle capacitor metal layer; and
forming a top capacitor metal layer over the second capacitor dielectric layer at a position that is laterally offset from the bottom capacitor metal layer and the middle capacitor metal layer.

20. The method of claim 18, further comprising:
performing a planarization process on the capacitor ILD layer to form a substantially planar surface; and
forming a substantially planar second etch stop layer disposed over the capacitor ILD layer.

* * * * *